United States Patent [19]

Herschdorfer et al.

[11] 4,292,106

[45] Sep. 29, 1981

[54] PROCESS OF PRODUCING REINFORCED LAMINATES FROM CROSSLINKABLE THERMOPLASTIC OLEFIN POLYMER MATERIAL

[75] Inventors: C. George Herschdorfer, Port Chester, N.Y.; Dennis J. Vaughan, Anderson, S.C.

[73] Assignee: Clark-Schwebel Fiber Glass Corp., White Plains, N.Y.

[21] Appl. No.: 51,837

[22] Filed: Jun. 25, 1979

Related U.S. Application Data

[63] Continuation-in-part of Ser. No. 923,654, Jul. 11, 1978, abandoned.

[51] Int. Cl.³ ............... B29D 7/14; B29D 7/16; B29D 9/04; B29D 23/04
[52] U.S. Cl. ............... 156/243; 156/244.11; 156/244.13; 156/244.14; 156/244.18; 156/244.23; 156/244.24; 156/244.27; 156/334
[58] Field of Search ........ 156/244.11, 244.23, 156/244.24, 244.26, 244.27, 282, 243, 311, 334, 244.13, 244.14, 244.18, 244.19; 428/420, 458, 482, 521

[56] References Cited

U.S. PATENT DOCUMENTS

| | | | |
|---|---|---|---|
| 2,714,571 | 8/1955 | Irion et al. | 156/244.11 |
| 3,013,915 | 12/1961 | Morgan | 156/244.23 |
| 3,094,449 | 6/1963 | Sisson | 156/244.14 |
| 3,222,237 | 12/1965 | McKelvy | 156/244.11 |
| 3,371,002 | 2/1968 | Reddeman | 156/244.23 |
| 3,470,055 | 9/1969 | Wade | 156/244.11 |
| 3,472,729 | 10/1969 | Sterman et al. | 264/90 |
| 3,480,584 | 11/1969 | Archer et al. | 260/46.5 |
| 3,558,423 | 1/1971 | Rossetti | 156/306 |
| 3,646,155 | 2/1972 | Scott | 260/234 |
| 3,788,923 | 1/1974 | Solimen | 156/244.11 |
| 3,876,613 | 4/1975 | Needham et al. | 260/45.85 S |
| 3,929,550 | 12/1975 | Gaylord | 156/334 |
| 3,940,547 | 2/1976 | Needham et al. | 156/334 |
| 3,945,877 | 3/1976 | Marcozzi | 156/334 |

OTHER PUBLICATIONS

"New Line on Pipe List", Chemical Week, vol. 93, p. 37, (8/24/63).

"New Wraps For Cable", Chemical Week, vol. 93, p. 43, (1/11/64).

E. D. Gant and D. A. Trageser, "Industrial Applications of Electron Accelerators", J. Brit. Nuclear Energy Sol., vol. 6, p. 339, (1967).

J. R. Flesher, "Vulcanizable Polyethylene and High Voltage Cable Insulation" Wire and Wire Products, vol. 42, p. 622, (4/67).

"PE Roam Sets Up for Expansion," Modern Plastics International, vol. 2, p. 14,(4/72).

H. G. Scott and J. F. Humphries, "Novel Crosslinking Method for Polyethylene", Modern Plastics, vol. 50, p. 82, (3/73).

R. C. Peer, Jr. & D. J. Vaughan, "The Use of Polyethylene in Printed Circuit Laminates," Society of Plastics Engineers, 33rd Annual Tech. Conf., May 5-8, 1975, p. 443.

A. S. Wood, "New Day Dawns for Circuit Boards", Modern Plastics, vol. 54, p. 52, (6/77).

D. V. Rosato, "Electrical Wire and Cable Plastics Coating-What's Ahead", Wire and Wire Products, vol. 45, p. 49, (3/70).

L. M. Sloman, "Advantages of Power Cables with V.I.P. & Insulation", Electrical Times, p. 87, (4/70).

T. Engel, "Forging and Crosslinking of Thermoplastics", Plastics and Polymers, vol. 38, p. 174, (6/70).

"Halbzeuge Ausvernetztem Polyathylen", Kunststoffe, vol. 60, p. 402, (6/70).

"Cross-Linked PE Foam Goes Commercial", Modern Plastics, vol. 44, p. 100, (5/67).

J. E. Hagar, "Guide to Wire and Cable Coating: Part 2-Extending Crosslinkable PE", Plastics Tech., vol. 15, p. 55, (7/69).

W. Noll, "Chemistry and Technology of Silicones, "Chapter 8, Academic Press, N. Y., (1968).

K. S. Tenney, "Injection Molding Crosslinkable Polyolefins," SPE 27th Annual Conference Papers, vol. 15, p. 191, (1969).

*Primary Examiner*—Caleb Weston
*Attorney, Agent, or Firm*—Kenyon & Kenyon

[57] ABSTRACT

A process for producing reinforced laminates from crosslinkable thermoplastic olefin polymer material. In the process, a normally solid, high molecular weight crosslinkable thermoplastic olefin polymer containing a catalyst which reacts with and effects crosslinking of the polymer and which has a decomposition temperature above the melting temperature of the polymer, is heated to a molten state at a temperature above the polymer melting temperature but below the catalyst decomposition temperature. A continuous nonreinforced sheet is then formed from the molten polymer at a temperature below the decomposition temperature and is applied to at least one surface of a substrate to form a laminate. The laminate is then heated under pressure to a temperature above the decomposition temperature of the catalyst to effect substantially complete crosslinking of the polymer and is cooled to a temperature below the polymer melting temperature to a self-supporting state to fix the shape of the laminate.

57 Claims, 2 Drawing Figures

Air Entry

PROCESS OF PRODUCING REINFORCED LAMINATES FROM CROSSLINKABLE THERMOPLASTIC OLEFIN POLYMER MATERIAL

This application is a continuation-in-part of copending application Ser. No. 923,654 filed July 11, 1978, abandoned for PROCESS OF PRODUCING REINFORCED LAMINATES FROM CROSSLINKABLE THERMOPLASTIC OLEFIN POLYMER MATERIAL.

BACKGROUND OF THE INVENTION

1. Field of the Invention

This invention relates to a process of producing reinforced flat sheet, tubular and contoured laminates from crosslinkable thermoplastic olefin polymer material.

2. Description of the Prior Art

Thermoplastic polyolefin resins, by virtue of their hydrocarbon structure, have a low dielectric constant and good electrical insulating properties. As a result, such resins have heretofore been used as wire and cable insulation and in reinforced compositions for electronics applications. In some applications of the latter type, the electrical loss of radio-frequency energy is not important and there are well-known dielectric materials, such as phenolic paper, epoxy paper, epoxy cotton, and several other grades of reinforced laminates which are presently used by the electrical industry. Each of these materials varies in usefulness depending upon cost, dielectric properties, and operating temperatures.

There has been a recent trend toward the use of microwave devices and a need has arisen for dielectric products having the lowest possible electrical loss in terms of dissipation factor and loss tangent and which are flame-retardant, drip proof, resistant to chemicals and cold-punchable. The materials presently used by the electrical industry described above are limited in electrical properties at microwave frequencies. This characteristic thus limits their usefulness in many such applications.

Polyolefin resins have desirable electrical properties as a homogeneous dielectric material. These resins have been combined with a suitable reinforcing substrate, such as glass fabric, to produce laminates having some of the thermosetting properties of materials like the epoxy resins. The use of such a reinforcing substrate improves the physical properties of the resin and produces a reinforced polyolefin possessing good dimensional, tensile, flexural, bursting and tear strengths.

Polyolefin resins have a relatively low softening point and poor heat resistance, however. These characteristics render the resins unsuitable for the majority of electrical applications where the addition of metallic foils followed by some form of soldering is required, such as, for example, in printed circuit board fabrication. As a result, although such laminates have the desired electrical characteristics and adequate strength, exposure of the laminates to elevated temperatures generally causes delamination of the laminate. Furthermore, such resins drip when heated and are not flame-retardant.

One solution to the foregoing problem is to first crosslink the polymer and then combine it with the reinforcing substrate. Crosslinking can be achieved by irradiating sheets of crosslinkable polyolefin with high-energy electrons after extruding the sheets and prior to forming the laminate. Reinforced polyolefin laminates of this type have been fabricated by combining a thermoplastic olefin polymer such as polyethylene crosslinked by irradiation and a reinforcing substrate such as glass fiber by applying the polymer to the reinforcing substrate and then heating the laminate to fuse the resin to the substrate. Irradiation of the polymer sheet material and the subsequent assembly of the sheet material into a laminate by combining the sheet material with a reinforcing substrate and heating the combination under pressure to achieve consolidation is, however, both expensive and difficult to maintain in continuous production.

Crosslinking of the polyolefin used to form the laminate can also be chemically achieved by the use of heat and a catalyst. Such crosslinking has, however, heretofore produced a non-homogeneous, variable dielectric polyolefin material.

SUMMARY OF THE INVENTION

It is therefore an object of the present invention to provide a process of producing reinforced laminates from crosslinkable thermoplastic olefin polymer material which overcomes the aforementioned disadvantages of heretofore known processes.

It is also an object of the present invention to provide a process of producing reinforced laminates from crosslinkable thermoplastic olefin polymer material which permits the efficient and economic production of reinforced laminates from such material.

It is still another object of the present invention to provide a process of producing reinforced laminates from crosslinkable thermoplastic olefin polymer material without utilizing irradiation or other unusual processes to achieve crosslinking of the polyolefin.

It is still a further object of the present invention to provide a process of producing reinforced laminates from crosslinkable and flame retardant thermoplastic olefin polymer material which enables such laminates to be utilized in such applications as printed circuit board fabrication, microwave strip transmission and in electrical insulation components.

These and other objects of the invention are achieved in a process of producing reinforced laminates from crosslinkable thermoplastic olefin polymer material comprising the steps of heating a normally solid, high molecular weight crosslinkable thermoplastic olefin polymer selected from the group consisting of polymers and copolymers of at least one mono-1 olefin having 2 to 8 carbon atoms per molecule and containing a catalyst which reacts with and effects crosslinking of the polymer and which has a decomposition temperature above the melting temperature of the polymer, to a molten state at a temperature above the polymer melting temperature but below the catalyst decomposition temperature; forming a continuous non-reinforced sheet from the molten polymer at a temperature below the catalyst decomposition temperature; cooling the continuous sheet to a temperature below the polymer melting temperature to a self-supporting, two-dimensional molecular state; combining the sheet in its self-supporting state with a substrate to form a laminate; heating the laminate under pressure to a temperature above the catalyst decomposition temperature to react the catalyst with the polymer and effect substantially complete crosslinking of the polymer to a three-dimensional molecular state; and cooling the laminate to a temperature below the polymer melting temperature to a self-supporting state.

In the preferred embodiments of this process of the invention, the polymer comprises a solid, high molecular weight crosslinkable thermoplastic olefin polymer selected from the group consisting of ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970; the catalyst comprises an organic peroxide catalyst, specifically 2,5 dimethyl 2,5-di(t-butylperoxy)hexyne-3; the polymer is heated to a molten state at a temperature between about 270° F. and about 300° F.; the laminate is heated under pressure to a temperature between about 310° F. and about 525° F.; the continuous sheet is preferably formed from the molten polymer by extruding the polymer at a temperature between about 270° F. and about 300° F., or by extruding the molten polymer at a temperature between about 270° F. and 300° F. to form a tube closed at one end thereof, blowing air into the tube from the other end thereof under pressure to expand the tube and form an elongated tube having a predetermined wall thickness, flattening the elongated tube, slitting the flattened tube along at least one side thereof so as to form a continuous sheet from the polymer; and the laminate is preferably heated to react the catalyst with the polymer and effect about 95% crosslinking of the polymer.

The continuous sheet may be combined with a metallic foil substrate, for example, a copper foil substrate, or a glass fibrous substrate to form a laminate. The glass fibrous substrate is preferably treated with a coupling agent, for example, an unsaturated organosilanol coupling agent, which reacts with the polymer and the glass fibrous substrate and effects bonding of the polymer to the substrate to form a laminate. The preferred coupling agent comprises gamma-methacryloxypropyltrimethoxy silane. A sheet of metallic foil, such as a sheet of copper foil, may be combined with the laminate subsequent to combining the continuous sheet with the glass fibrous substrate and prior to heating the laminate.

The polymer may contain a thiodipropionate acid ester flame-retardant, preferably dilaurylthiodipropionate, in addition to the catalyst. The laminate formed by the continuous sheet and substrate may be cut and shaped subsequent to the step of combining the sheet with the substrate and prior to the step of heating the laminate, and a plurality of laminates may be superposed subsequent to combining the sheet with the substrate and prior to the step of heating the laminate. In the latter embodiment, the step of heating the laminate comprises heating the superposed laminates under pressure to a temperature above the decomposition temperature of the catalyst to react the catalyst with the polymer and effect substantially complete crosslinking of the polymer to a three-dimensional molecular state and combine the plurality of superposed laminates. A sheet of metallic foil, for example, copper foil, may be combined with the laminate subsequent to the steps of cutting and shaping and prior to the step of heating the laminate.

In another embodiment of the process of the invention, a continuous non-reinforced sheet is formed in a two-dimensional molecular state from the molten polymer at a temperature below the catalyst decomposition temperature and the continuous sheet is applied to a substrate at a temperature above the melting temperature of the polymer to form a continuous laminate, i.e., laminate sheet. This laminate is then either immediately heated, after the sheet is applied to the substrate under pressure to a temperature above the catalyst decomposition temperature to react the catalyst with the polymer and effect substantially complete crosslinking of the polymer to a three-dimensional molecular state, or is first cooled to a temperature below the melting temperature of the polymer to a self-supporting state after application to the substrate and then subsequently heated under pressure to effect crosslinking. The heated laminate is then cooled to a temperature below the melting temperature of the polymer to a self-supporting state.

In the preferred embodiments of this process of the invention, the polymer comprises a normally solid, high molecular weight crosslinkable thermoplastic olefin polymer selected from the group consisting of ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970, and the catalyst comprises an organic peroxide catalyyst, preferably 2,5 dimethyl 2,5-di(t-butylperoxyy)hexyne-3. The polymer is heated to a molten state at a temperature between about 270° F. and about 300° F., the laminate is heated under pressure to a temperature between about 310° F. and about 525° F. to react the catalyst with the polymer and effect substantially complete crosslinking of the polymer, and the sheet is formed by extruding the molten polymer at a temperature between about 270° F. and about 300° F., or by extruding the molten polymer at a temperature between about 270° F. and 300° F. to form a tube closed at one end thereof, blowing air into the tube from the other end thereof under pressure to expand the tube and form an elongated tube having a predetermined wall thickness, flattening the elongated tube, and slitting the flattened tube along at least one side thereof so as to form a continuous sheet from the polymer. The laminate is preferably heated to effect about 95% crosslinking of the polymer and the continuous sheet is applied to a glass fibrous substrate preferably under pressure at a temperature of at least 270° F. to cause the sheet to impregnate the glass fibrous substrate and form a continuous laminate, i.e., laminate sheet. The substrate is preferably treated with a coupling agent, specifically an unsaturated organosilanol coupling agent such as gamma-methacryloxypropyltrimethoxy silane, which reacts with the polymer and the glass fibrous substrate and effects bonding of the polymer to the substrate prior to applying the continuous sheet to the substrate. A sheet of metallic foil, such as copper foil, may be applied to one surface of the laminate subsequent to the step of applying the sheet to the substrate and prior to the step of heating the laminate, and the polymer may contain a thiodipropionate acid ester flame-retardant, for example, dilaurylthiodipropionate, in addition to the catalyst.

If the laminate is cooled subsequent to the step of applying the continuous sheet to the substrate, the laminate may be cut and shaped subsequent to the step of cooling the laminate and prior to the step of heating the laminate, and a plurality of the laminates may be superposed. In this latter embodiment, the step of heating the laminate comprises heating the superposed laminates under pressure to a temperature above the catalyst decomposition temperature to react the catalyst with the polymer and effect substantially complete crosslinking of the polymer to a three-dimensional molecular state and combine the plurality of superposed laminates. A sheet of metallic foil, for example, copper foil, may be applied to at least one surface of the laminate subsequent to the steps of cutting and shaping and prior to the step of heating the laminate.

The foregoing objects of the invention are also achieved in reinforced laminates of crosslinkable thermoplastic olefin polymer material produced by the process of the invention.

The reinforced laminates produced by the process of the invention do not have many of the characteristics of thermoplastic materials. The laminates do have excellent physical properties, particularly flexibility, high strength and resistance to heat, as well as excellent electrical properties, good chemical and solder resistance and none of the drip characteristics normally associated with thermoplastics. The laminates also have a flame-retardancy which is equivalent to FR-4 grade epoxies and are truly cold-punchable. As a result, it has been possible to effectively utilize crosslinkable polyolefin laminates in such applications as printed circuit board fabrication, microwave strip transmission and electrical insulating components.

These and other novel features and advantages of the invention will be described in greater detail in the following detailed description.

DETAILED DESCRIPTION

Figure 1:
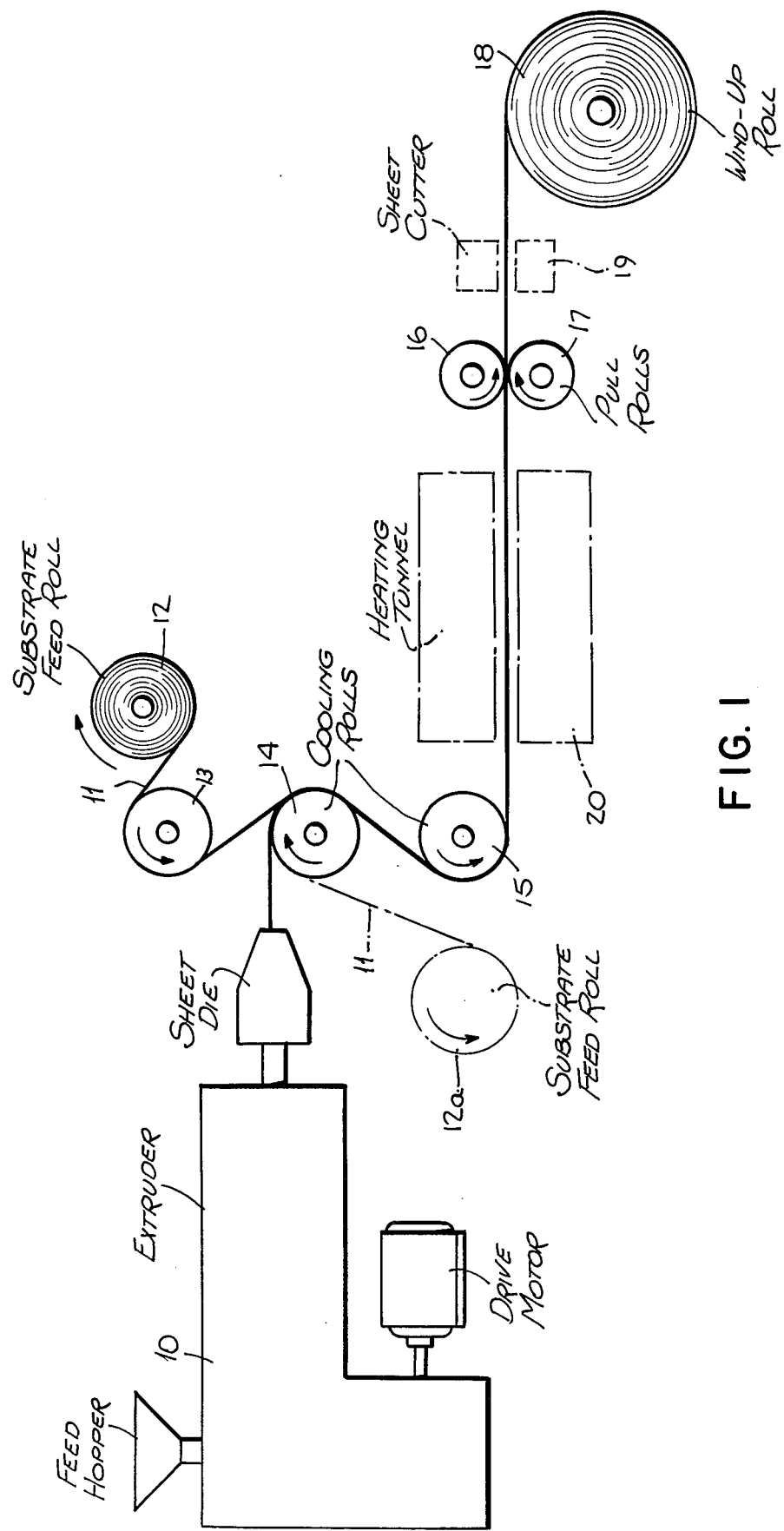
FIG. 1 is a schematic illustration of one embodiment of an apparatus for carrying out a process of producing reinforced laminates from crosslinkable thermoplastic olefin polymer material in accordance with the invention.

In accordance with the invention, and with specific reference to the drawings, a normally solid, high molecular weight crosslinkable thermoplastic olefin polymer containing a catalyst, i.e., crosslinking agent, which reacts with and effects crosslinking of the polymer and which has a decomposition temperature above the melting temperature of the polymer, is heated to a molten state below the catalyst decomposition temperature. The polymer may comprise any polymer or copolymer of at least one mono-1 olefin having 2 to 8 carbon atoms per molecule, for example, polymers of ethylene, propylene and butene-1 and copolymers of ethylene and butene-1 and ethylene and hexene-1. Ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970, are preferred.

The polymer is compounded, for example, by blending, with an organic peroxide catalyst, specifically acetylenic diperoxy compounds, in an amount between 0.1 to 5 percent and preferably 0.5 to 2 percent by weight based on the weight of the polymer. Representative peroxides are 2,7-dimethyl-2,7-di(t-butylperoxy) octadiyne-3,5; 2,7-dimethyl-2,7-di(peroxy ethyl carbonate)octadiyne-3,5; 3,6-dimethyl-3,6-di(peroxy ethyl carbonate)octyne-4; 3,6-dimethyl-3,6-(t-butylperoxy)octyne-4; 2,5-dimethyl-2,5-di(peroxybenzoate)hexyne-3; 2,5-dimethyl-2,5-di(peroxy-n-propyl carbonate)-hexyne-3; 2,5-dimethyl-2,5-di(peroxy isobutyl carbonate)hexyne-3; 2,5-dimethyl-2,5-di(peroxy ethyl carbonate)hexyne-3; 2,5-dimethyl-2,5-di(alpha-cumyl peroxy)hexyne-3; 2,5-dimethyl-2,5-di(peroxy beta-chloroethyl carbonate)hexyne-3; and 2,5-dimethyl-2,5-di(t-butylperoxy)hexyne-3. 2,5 dimethyl 2,5-di(t-butylperoxy) hexyne-3 is the preferred catalyst.

By way of example, a polyethylene polymer will soften and deform when heated to a temperature of about 250° F. or less and melts at a temperature above 250° F. The organic peroxide catalysts listed above decompose and will react with and effect crosslinking of the polymer when heated to a temperature between about 310° F. and about 525° F. Thus, in accordance with the process of the invention, a polyethylene polymer containing the organic peroxide catalyst is heated to a molten state at a temperature between about 270° F. and about 300° F., and preferably at a temperature of 290° F. A continuous sheet is then formed from the molten polyethylene using a sheet extruder (generally identified by reference numeral 10 in the drawing). It should be noted that it is necessary to carefully control the temperature at which the sheet extrusion is carried out and that it must be maintained below the decomposition temperature of the catalyst, yet high enough, i.e. at least at the melting temperature of the polymer (above 250° F.), so that the heat-softened resin can penetrate the interstices of the substrate when the sheet is applied under pressure thereto.

The heating zones of the extruder are usefully maintained below the temperature of about 300° F. and above a temperature of about 250° F. The thickness of the extruded sheet may vary from about 0.005 to about 0.060 inch or more. The cylinder pressure is usefully maintained from 0 psig at the feed hopper of the extruder to about 1500 psig at the extruder head, and the die pressure at about 800 to 1500 psig depending on screw speed. The temperature of the extruded sheet is usefully maintained at between about 270° F. and 310° F. and the extruder die temperature between about 250° F. and about 260° F.

Referring now to FIG. 1, a polyethylene polymer is thus extruded by extruder 10 from a sheet die at a cylinder pressure of 0–1500 psig and a die pressure of 800–1500 psig, depending upon screw speed, and a temperature between about 270° F. and about 300° F. as a continuous film having a thickness of 0.005 to 0.060 inches or more onto one surface of a planar substrate 11 to form a continuous laminate, i.e., laminate sheet. The substrate is unwound from a feed roll 12, and, if desired, a second substrate is simultaneously unwound from another feed roll 12a, and passes over a plurality of driven polish rolls 13, 14 and 15 of the extruder and through a nip formed by rolls 13 and 14. The latter roll, i.e., roll 14, and roll 15 are water-cooled to a temperature between about 150° F. and 230° F. to cool the laminate to a self-supporting, two-dimensional molecular state, known in the art as a "B-stage" product, and solidify the molten polymer. The reinforced continuous laminate formed at the nip of rolls 13 and 14 is then passed over roll 15 and through another nip formed by rolls 14 and 15 which exert pressure on the laminate to cause the sheet to adhere to the substrate. The continuous laminate of the cross-linkable polymer sheet material and the substrate then travels through a pair of driven rubber pull rolls 16 and 17 and is wound on a wind-up roll 18 which is spaced apart from the extruder. The continuous laminate may also be cut into a plurality of individual sheets by a shear or sheet cutter 19 disposed between pull rolls 16 and 17 and wind-up roll 18 instead of being wound on roll 18 and may also be shaped, layered and molded into cylinder shapes, boat hulls and the like. The laminate is then crosslinked in any of the previously-described forms by heating the laminate under pressure to a temperature above the catalyst decomposition temperature, specifically between about 310° F. and about 525° F. and preferably to a temperature of 450° F., for between 1 and 60 minutes and preferably 5 and 15 minutes to react the peroxide catalyst with the polymer and effect substantially complete crosslinking of the resin, i.e., 80% or greater crosslinking of the resin, to a three-dimensional molecular state, known in the art as a "C-Stage" product. The reaction time is preferably chosen so that the polymer in the laminate is approximately 95% crosslinked after heating under pressure. The degree of crosslinking of the polyethylene can be determined by calculating the percentage of the crosslinked polymer which is insoluble in boiling xylene. The continuous laminate may also be immediately heated to effect crosslinking after formation of the laminate in a heating tunnel 20 disposed between the polish rolls of the extruder and pull rolls 16 and 17. In this case, the extruder rolls would not be water-cooled for cooling but would function to apply pressure to the laminate to cause the polymer sheet to adhere to the substrate, and heating the laminate in the heating tunnel would not include the application of pressure to the laminate. Subsequent to processing the laminate in accordance with the methods described above, the heated laminate is cooled after heating to a temperature below the melting temperature of the polymer to a self-supporting state to fix the shape of the laminate.

It should be noted that the above conditions pertain suitably to polyethylene and that modest variations therefrom may readily be determined for other polyolefins contemplated by this invention.

The substrate to which the polymer film is applied preferably comprises a glass fibrous substrate such as a woven glass fabric which has been treated with a polyolefin compatible coupling agent which produces a bond between the polymer and the surface of the glass fabric. A bond which is extremely strong and can be maintained under the most severe environmental conditions is produced by unsaturated organosilanol coupling agents such as vinyltrimethoxy silane, alkyl silane and trimethoxysilylpropylacrylate silane. The preferred coupling agent is gamma-methacryloxypropyltrimethoxy silane. Also, although a woven glass fiber or fabric substrate is preferred, the polymer may be applied to other suitable substrates, such as woven and non-woven glass and aramide fiber or fabric, asbestos, nylon, polycarbonate and poly(arylene sulfide) substrates, metallic or metallized foil, cellulosic or non-cellulosic paper or paper substitute substrates, or substrates of a differing polymeric structure.

As previously stated, the polymer preferably has a high melt index, i.e., a melt index which is at least about 10, to facilitate extrusion of the polymer below the catalyst decomposition temperature. It should be noted, however, that polyolefins having a melt index from below 0 to about 50 can also be used to extrude the continuous sheet.

The continuous sheet may also be formed by calendering or pultrusion. Formation of the continuous sheet from the molten polymer by extrusion is preferred over calendering or pultrusion, however, since this method permits a more precise and accurate control of the temperature of the molten polymer during formation of the sheet. The continuous sheet may also be advantageously formed by a process of blown film extrusion in which the molten polymer is first extruded and then blown into a tube. In such a process, a predetermined length of a hollow tube is formed by extrusion of the polymer through a split die and the tube is sealed closed at one end. The interior space of the tube is then inflated by means of compressed air introduced into the tube through a blowing tube concentrically disposed in the die with respect to the extruded polymer or located laterally or above the tube neck in the die.

Figure 2:
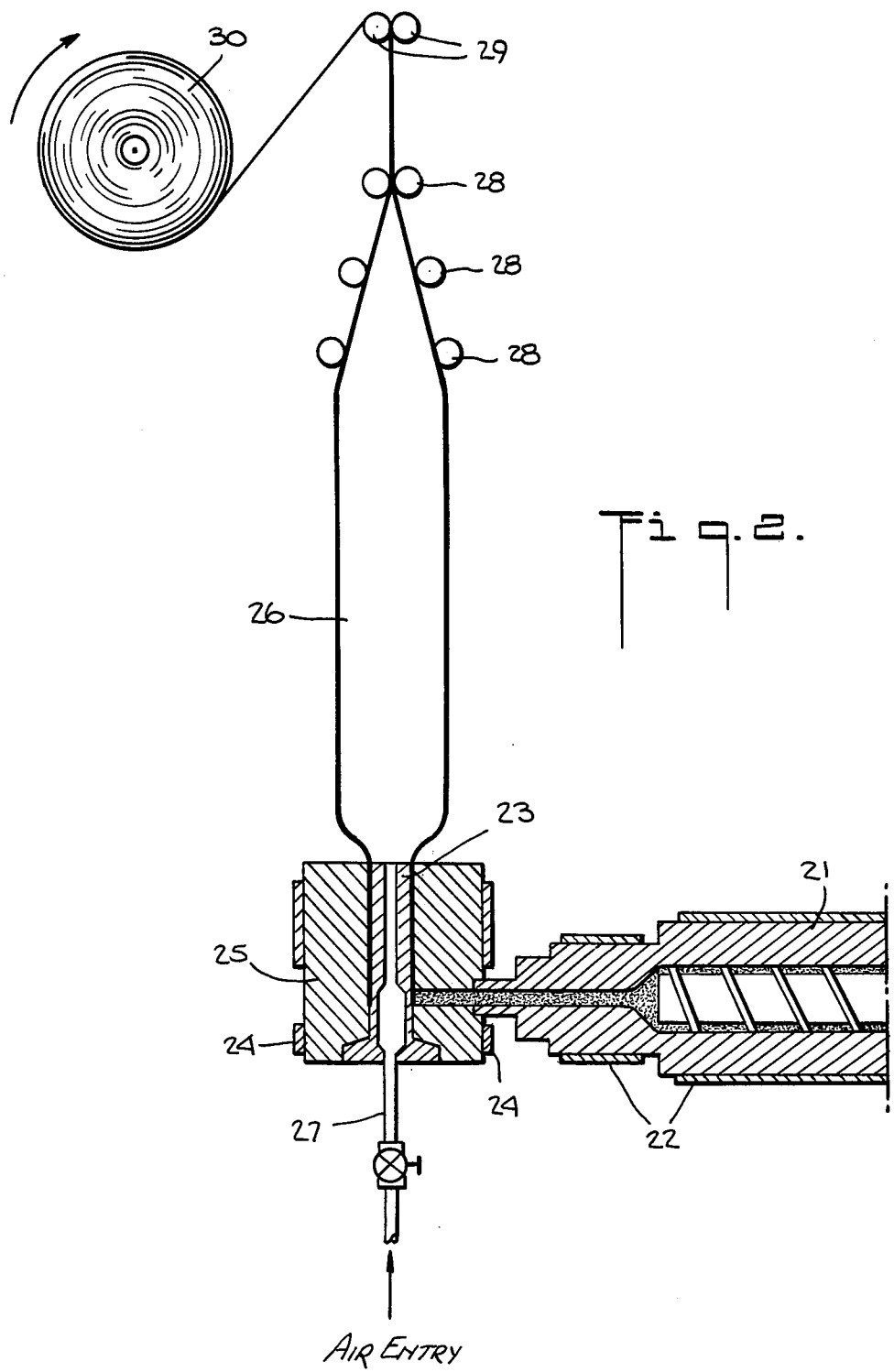
FIG. 2 is a schematic illustration of another embodiment of an apparatus for carrying out the process of the invention.

Referring to FIG. 2, a molten polymer is extruded from an extruder 21 including a plurality of heaters 22, around a mandrel 23 also including a plurality of heaters 24, and through an annular-shaped opening in a circular die 25 to form a closed polymer tube. This tube is then expanded into an elongated tube having a wall thickness of less than 5 mils by blowing compressed air at a pressure between 10 and 20 p.s.i. through a blowing tube 27 extending through the center of the mandrel. It is important that a constant air pressure be maintained during expansion of the tube in order to provide a film of uniform thickness. The tube 26 is extruded vertically upwardly, as the speed of the extruder 21 and the air pressure used to inflate the tube to the wall thickness desired, which are empirically determined, are adjusted. The molten polymer forming the elongated tube is cooled by the compressed air to a temperature below its melting temperature to a self-supporting, two-dimensional molecular state, i.e., a "B-Stage" product, and is drawn between a plurality of guide rolls 28 and a pair of pinch rolls 29 which flatten the tube and feed the flattened tube to a wind-up roll 30. The flattened tube is subsequently unwound from roll 30 and is either slit along one side and laid flat to form a continuous sheet, or slit along both sides to form a continuous sheet having a thickness which is twice that of the wall thickness of the tube.

As in the sheet extrusion process described previously herein, it is necessary to carefully control the temperature at which the tube is extruded, i.e., the temperature must be maintained below the decomposition temperature of the polymer catalyst but above the melting point of the polymer. The heating zones of the extruder are thus maintained below a temperature of about 300° F. and above a temperature of about 250° F., and the cylinder and die pressures maintained between about 0-1500 p.s.i. and 600-800 p.s.i., respectively, depending upon screw speed.

Formation of the continuous sheet by means of the foregoing blown film extrusion process permits sheets having a thickness of less than 5 mils to be consistently and economically produced. Blown film extrusion also permits the formation of sheets having a greater width and more uniform strength in the longitudinal and transverse directions. The advantages of thinner polymer sheets, particularly those having a thickness of 1 mil and below, are that laminates formed from such sheets are more flexible and can be used in flexible circuitry applications. Also, the resin content in laminates produced using such sheets is reduced, thereby reducing the cost of producing the laminates. Moreover, such sheets may be applied to both sides of a substrate to produce a laminate having a resin content similar to that obtained by applying a sheet having a greater thickness to one side of the substrate and also assures more complete coverage of the substrate. Applying the sheets to both sides of the substrate also enhances the dimensional stability of the laminate and reduces laminate curl.

The continuous reinforced laminate produced by the process of the invention may, as previously described, be immediately heated to effect crosslinking of the polymer or may first be cooled and then heated under pressure. In the latter case, the laminate may be cut and shaped prior to heating. A sheet of metallic foil may be applied to the laminate or individual sheets of the laminate before heating to combine it with the laminate during the crosslinking process in either case. The continuous sheet may also be cooled to a self-supporting state before it is combined with a substrate instead of being immediately combined with the substrate. In this case, the sheet may be combined with a metal foil substrate, such as a copper foil substrate, or a glass fibrous substrate with which a metal foil can subsequently be combined prior to heating the laminate to effect crosslinking. The laminate formed by the cooled polymer sheet and the substrate can be cut and shaped prior to heating and pressing, and in all of the foregoing cases a plurality of laminates may be superposed before heating to produce a rigid laminate.

The polymer is preferably also compounded, for example, by blending, with a thiodipropionate acid ester flame-retardant to render the crosslinked reinforced laminate flame resistant. The preferred flame-retardant is dilaurylthiodipropionate. Reinforcing and filling materials such as glass, aramid or similar materials, or other compositions in the form of beads, fibers, mats, artificial paper, rovings, woven roving, fabric or unwoven fabric may also be compounded with the polymer to improve the physical properties of the laminates. Crosslinking of the laminate to fix its shape can be effected by any known shaping technique such as by pressing and compression molding.

The foregoing process of the invention is illustrated by the following examples.

EXAMPLE I

A normally solid, high-molecular weight polyethylene resin having a density of 0.965 g/cc and a melt index of 30 g/10 minutes which had been blended with 0.75 weight percent of 2.5 dimethyl 2,5-di(t-butylperoxy)-hexyne-3 (Lupersol 130) and 0.04 weight percent of dilaurylthiodipropionate (CL-100, Phillips Petroleum Company) was extruded as a thin continuous film having a thickness of approximately 3 mils by means of an extruder having a one-inch diameter nozzle attached to a multichannel adjustable die. This film was applied simultaneously with extrusion to a Clark-Schwebel Style 7628 woven glass fabric substrate the surface of which had been treated with a gammamethacryloxypropyltrimethoxy silane coupling agent (Clark-Schwebel CS-271) to form a 30-35% glass, 65-70% polyethylene laminate. The glass fabric was fed at a speed of 15-20 feet per minute from an overhead stand into contact with the extruded molten polyethylene at the extruder die and between the nip of a pair of water-cooled rollers to solidify the polyethylene sheet material. The resulting continuous laminate was then wound onto a wind-up roll.

Thirteen plies (individual sheets cut from the continuous laminate) of the reinforced continuous laminate so produced were then superposed to form a rigid laminate and placed in a preheated press at a temperature of 350° F. A pressure of 20 tons load for each 12"×12" surface area of the laminate was applied. After 30 minutes, the temperature was raised to 450° F. and the pressure increased at the rate of 10 tons per minute to 40 tons load. The laminate was maintained under these conditions for an additional 30 minutes to crosslink the polyethylene and combine the polyethylene sheets with the glass substrates. The laminate was then cooled to ambient temperature and removed from the press.

The foregoing process was then repeated by extruding continuous polyethylene films having thicknesses of 6 mils and 9 mils onto glass fabric substrates treated with the same coupling agent and then forming rigid laminates of 7 and 6 plies of the reinforced continuous laminates so produced, respectively. These laminates were placed in the press and heated under pressure at the same temperatures and pressures to crosslink the polyethylene and combine the polyethylene sheets with the glass substrates. The electrical and physical properties of the rigid laminates so produced are set forth below in Table I.

In order to determine the degree of crosslinking, approximately 1 gram test samples of the laminates were accurately weighed and then boiled in xylene under reflux for 24 hours. After refluxing, the solid material was removed from the xylene and dried and reweighed, and the percentage of insoluble material in the resin calculated. It was thus determined that the polyethylene sheets of the laminates were about 91% crosslinked.

TABLE I

THE ELECTRICAL AND PHYSICAL PROPERTIES OF POLYETHYLENE LAMINATES MANUFACTURED FROM STYLE 7628 GLASS FABRIC

|  | Film Thickness | | |
| --- | --- | --- | --- |
|  | 3 Mil | 6 Mil | 9 Mil |
| Number of Plies | 13 | 7 | 6 |
| Thickness, Inches | 0.071 | 0.073 | 0.077 |
| Water Absorption at 23° C., % | 0.056 | 0.045 | 0.014 |
| Resin Content, % | 31.2 | 44.9 | 51.7 |
| Specific Gravity | 1.64 | 1.49 | 1.36 |
| Flexural Strength, psi, Dry | 25,913 | 16,559 | 13,560 |
| Wet, 2 hours at 100° C. | 28,349 | 16,616 | 12,666 |
| Strength Retention, % | 109.4 | 100.0 | 93.6 |
| Wet, 48 hours at 100° C. | 28,267 | 16,716 | 13,189 |
| Strength Retention, % | 109.1 | 101.0 | 97.3 |
| Flexural Modulus, Dry | 1.92 | 1.0 | 0.71 |
| Wet, 2 hours at 100° C. | 1.93 | 1.09 | 0.75 |
| Wet, 48 hours at 100° C. | 2.06 | 1.03 | 0.69 |
| Compressive Strength, psi, Dry | 10,509 | 6,127 | 6,017 |
| Wet, 2 hours at 100° C. | 11,511 | 5,546 | 5,177 |
| Strength Retention, % | 109.5 | 90.5 | 86.0 |
| Tensile Strength, psi, Dry | 33,679 | 21,155 | 16,370 |
| Wet, 2 hours at 100° C. | 32,635 | 22,681 | 15,757 |
| Strength Retention, % | 96.3 | 107.2 | 96.3 |
| Dielectric Constant at 1 MC/Second | | | |
| Condition A | 3.43 | 3.02 | 2.85 |
| Condition D, 48/50 | 3.50 | 3.20 | 2.93 |
| Dissipation Factor at 1 MC/Second | | | |
| Condition A | 0.0014 | 0.0011 | 0.001 |
| Condition D, 48/50 | 0.009 | 0.033 | 0.014 |
| Dielectric Breakdown, KV | | | |
| Condition A S/T | 48 Broke | 70 Broke | 70 NB |
| Condition A S/S | — | — | 70 NB |
| Condition D, 48/50, S/T | — | — | 70 NB |
| Condition D, 48/50, S/S | — | — | 70 NB |

EXAMPLE II

In a manner similar to Example I, a polyethylene polymer with the same properties as that used in Example I was extruded as a continuous film in thicknesses of 1.5 mils, 3 mils, 6 mils and 10 mils onto a Clark-Schwebel Style 108 woven glass fabric substrate treated with CS-271 to form a 48–17% glass, 52–83% polyethylene laminate. Rigid laminates of 18, 14, 9 and 7 plies, respectively, of the reinforced continuous laminates so produced were then assembled and heated under pressure in a press as in Example I to crosslink the polyethylene and combine the polyethylene sheets with the glass substrates. The electrical and physical properties of the rigid laminates so produced are set forth in Table II below.

TABLE II
THE ELECTRICAL AND PHYSICAL PROPERTIES OF POLYETHYLENE LAMINATES MANUFACTURED FROM STYLE 108 GLASS FABRIC

| | Film Thickness | | | |
|---|---|---|---|---|
| | 1.5 Mil | 3 Mil | 6 Mil | 10 Mil |
| Number of Plies | 18 | 14 | 9 | 7 |
| Thickness, Inches | 0.061 | 0.062 | 0.066 | 0.071 |
| Water Absorption at 23° C., % | 0.007 | 0 | 0 | 0.01 |
| Resin Content, % | 52.2 | 63.0 | 76.7 | 82.6 |
| Specific Gravity | 1.42 | 1.20 | 1.07 | 1.02 |
| Flexural Strength, psi, Dry | 17,043 | 13,629 | 9,788 | 8,325 |
| Wet, 2 hours at 100° C. | 19,618 | 12,385 | 9,746 | 8,363 |
| Strength Retention, % | 115.1 | 90.9 | 99.6 | 100.0 |
| Wet, 48 hours at 100° C. | 20,273 | 13,247 | 10,266 | 8,253 |
| Strength Retention, % | 119.0 | 97.2 | 104.9 | 99.0 |
| Flexural Modulus, Dry | 1.21 | 0.67 | 0.48 | 0.40 |
| Wet, 2 hours at 100° C. | 1.18 | 0.68 | 0.43 | 0.42 |
| Wet, 48 hours at 100° C. | 1.17 | 0.71 | 0.49 | 0.37 |
| Compressive Strength, psi, Dry | 5,848 | 5,230 | 4,610 | 3,624 |
| Wet, 2 hours at 100° C. | 6,022 | 4,871 | 3,342 | 2,840 |
| Strength Retention, % | 109.7 | 93.1 | 72.5 | 78.4 |
| Tensile Strength, psi, Dry | 23,000 | 14,369 | 11,834 | 9,090 |
| Wet, 2 hours at 100° C. | 21,325 | 13,679 | 12,391 | 8,449 |
| Strength Retention, % | 92.7 | 95.2 | 104.7 | 93.0 |
| Dielectric Constant at 1 MC/Second | | | | |
| Condition A | 2.82 | 2.66 | 2.46 | 2.40 |
| Condition D, 48/50 | 2.87 | 2.70 | 2.51 | 2.45 |
| Dissipation Factor at 1 MC/Second | | | | |
| Condition A | 0.001 | 0.0011 | 0.0008 | 0.0001 |
| Condition D, 48/50 | 0.007 | 0.006 | 0.0015 | 0.0006 |
| Dielectric Breakdown, KV | | | | |
| Condition A S/T | 70 NB | 70 NB | 70 NB | 70 NB |
| Condition A S/S | 70 NB | 70 NB | 70 NB | 70 NB |
| Condition D, 48/50, S/T | 52 Broke | 62 Broke | 56 Broke | 70 NB |
| Condition D, 48/50, S/T | — | — | — | 70 NB |

EXAMPLE III

In a manner similar to Example I, a polyethylene polymer with the same properties as that used in Example I was extruded as a continuous film in thicknesses of 4 mils, 15 mils and 20 mils onto a Clark-Schwebel Style 7637 woven glass fabric substrate treated with CS-271 to form a 67–32% glass, 33–68% polyethylene laminate. Rigid laminates of 11, 4 and 3 plies, respectively, of the reinforced continuous laminates so produced were then formed and heated under pressure in a press as in Example I to crosslink the polyethylene and combine the polyethylene sheets with the glass substrates. The electrical and physical properties of the rigid laminates so produced are set forth in Table III below.

TABLE III
THE ELECTRICAL AND PHYSICAL PROPERTIES OF POLYETHYLENE LAMINATES MANUFACTURED FROM STYLE 7637 GLASS FABRIC

| | Film Thickness | | |
|---|---|---|---|
| | 4 Mil | 15 Mil | 20 Mil |
| Number of Plies | 11 | 4 | 3 |
| Thickness, Inches | 0.077 | 0.073 | 0.078 |
| Water Absorption at 23° C., % | 1.41 | 0.067 | 0.049 |
| Resin Content, % | 33.5 | 67.3 | 55.5 |
| Specific Gravity | 1.54 | 1.28 | 1.13 |
| Flexural Strength, psi, Dry | 11,974 | 11,136 | 7,672 |
| Wet, 2 hours at 100° C. | 12,087 | 10,373 | 7,643 |
| Strength Retention, % | 100.0 | 93.2 | 99.6 |
| Wet, 48 hours at 100° C. | 12,918 | 11,522 | 8,484 |
| Strength Retention, % | 167.9 | 103.0 | 113.2 |
| Flexural Modulus, Dry | 0.94 | 0.60 | 0.36 |
| Wet, 2 hours at 100° C. | 0.96 | 0.63 | 0.39 |
| Wet, 48 hours at 100° C. | 0.97 | 0.61 | 0.41 |
| Compressive Strength, psi, Dry | 4,455 | 4,706 | 3,156 |
| Wet, 2 hours at 100° C. | 4,595 | 5,469 | 3,810 |
| Strength Retention, % | 103.1 | 116.0 | 120.7 |
| Tensile Strength, psi, Dry | 14,614 | 10.778 | 6,417 |
| Wet, 2 hours at 100° C. | 16,806 | 11,249 | 7,367 |
| Strength Retention, % | 115.0 | 104.4 | 114.8 |
| Dielectric Constant at 1 MC/Second | | | |
| Condition A | 3.23 | 2.82 | 2.59 |
| Condition D, 48/50 | 4.00 | 2.84 | 2.74 |
| Dissipation Factor at 1 MC/Second | | | |
| Condition A | 0.0012 | 0.002 | 0.0010 |
| Condition D, 48/50 | 0.066 | 0.014 | 0.0017 |
| Dielectric Breakdown, KV | | | |
| Condition A S/T | 32 Broke | 70 NB | 70 NB |
| Condition A S/S | — | 70 NB | 52 Broke |
| Condition D, 48/50, S/T | — | 70 NB | — |
| Condition D, 48/50, S/S | — | 70 NB | — |

EXAMPLE IV

In a manner similar to Example I, a polyethylene polymer with the same properties as that used in Example I was extruded as a continuous film in thicknesses of 6,9 and 15 mils onto Clark-Schwebel Style 108, 7628, and 7637 woven glass fabric substrates, respectively, each treated with CS-271 to form 45–36% glass, 55–64% polyethylene laminates. Rigid laminates of 9, 7 and 4 plies, respectively, of the reinforced continuous laminates so produced were then formed and a layer of copper foil applied to one surface of each of the laminates. The laminates were then heated under pressure in a press as in Example I to crosslink the polyethylene and combine the polyethylene sheets with the glass substrates. The electrical and physical properties of the copper-clad rigid laminates so produced are set forth in Table IV below.

These laminates were subjected to a 20-minute immersion in methylene chloride and exposure to molten solder at 500° F. for five minutes with no apparent degradation of the physical properties of the laminates. The electrical and chemical properties of these laminates are set forth in Table V below.

TABLE IV
THE ELECTRICAL AND PHYSICAL PROPERTIES OF COPPER CLAD POLYETHYLENE-GLASS LAMINATES MANUFACTURED FROM STYLES 108, 7628 AND 7637 GLASS FABRIC

| | 108 | 7628 | 7637 |
|---|---|---|---|
| Film Thickness, Mils | 6 | 9 | 15 |
| Number of Plies | 9 | 7 | 4 |
| Thickness, Inches | 0.062 | 0.073 | 0.078 |
| Water Absorption at 23° C., % | Nil | 0.045 | 0.949 |

TABLE IV-continued
THE ELECTRICAL AND PHYSICAL PROPERTIES OF COPPER CLAD POLYETHYLENE-GLASS LAMINATES MANUFACTURED FROM STYLES 108, 7628 AND 7637 GLASS FABRIC

|  | 108 | 7628 | 7637 |
|---|---|---|---|
| Resin Content, % | 63.0 | 54.9 | 57.3 |
| Specific Gravity | 1.20 | 1.49 | 1.13 |
| Flexural Strength, psi, Dry | 13,629 | 16,559 | 7,672 |
| Wet, 2 hours at 100° C. | 12,385 | 16,616 | 7,643 |
| Strength Retention, % | 90.9 | 100.3 | 99.6 |
| Wet, 48 hours at 100° C. | 13,247 | 16,716 | 8,684 |
| Strength Retention, % | 97.2 | 101.0 | 113.2 |
| Flexural Modulus, Dry | 0.67 | 1.01 | 0.60 |
| Wet, 2 hours at 100° C. | 0.68 | 1.00 | 0.63 |
| Wet, 48 hours at 100° C. | 0.71 | 0.01 | 0.61 |
| Compressive Strength, psi, Dry | 5,230 | 6,127 | 3,156 |
| Wet, 2 hours at 100° C. | 4,871 | 5,546 | 3,810 |
| Strength Retention, % | 93.1 | 90.5 | 120.7 |
| Tensile Strength, psi, Dry | 14,348 | 21,155 | 10,778 |
| Wet, 2 hours at 100° C. | 13,679 | 22,681 | 11,249 |
| Strength Retention, % | 95.2 | 107.2 | 104.4 |
| Dielectric Constant at 1 MC/Second |  |  |  |
| Condition A | 2.64 | 2.45 | 2.59 |
| Condition D, 48/50 | 2.65 | 2.93 | 2.74 |
| Dissipation Factor at 1 MC/Second |  |  |  |
| Condition A | 0.001 | 0.001 | 0.002 |
| Condition D, 48/50 | 0.006 | 0.003 | 0.003 |
| Dielectric Breakdown, KV |  |  |  |
| Condition A S/T | 70 NB | 70 NB | 70 NB |
| Condition A S/S | 70 NB | 70 NB | 70 NB |
| Condition D, 48/50, S/T | 70 NB | 70 NB | 70 NB |
| Condition D, 48/50, S/S | 70 NB | 70 NB | 70 NB |

TABLE V
THE ELECTRICAL AND CHEMICAL PROPERTIES OF GLASS REINFORCED POLYETHYLENE LAMINATES

| Test | 108 | 7628 | 7637 |
|---|---|---|---|
| Peel Strength, inch/pound | 14 | 17 | 22 |
| Blister Test, minutes in Molten Solder at 260° C. | In excess of 5 | In excess of 5 | In excess of 5 |
| Blister Test, minutes in Molten Solder at 260° C. after 20 min. immersion in Methylene Chloride-Formic Acid | In excess of 5 | In excess of 5 | In excess of 5 |
| Resistance to Ferric Chloride | Excellent | Excellent | Excellent |
| Resistance to Ammonium Persulfate | Excellent | Excellent | Excellent |
| Resistance to Chromic Acid | Excellent | Excellent | Excellent |
| Resistance to Sulfuric Acid | Excellent | Excellent | Excellent |
| Dielectric Constant at 1 MC/Second after 1 hour in boiling water at 15 psi | 2.48 | 2.49 | 2.37 |
| Dissipation Factor at 1 MC/Second after 1 hour in boiling water at 15 psi | 0.007 | 0.008 | 0.006 |
| Dielectric Breakdown, KV, after 1 hour in boiling water at 15 psi | 70 NB | 70 NB | 70 NB |

The glass-polyethylene reinforced laminates produced by the process of the invention have a lower dielectric constant and power loss factor than laminates fabricated of conventional materials such as glass-reinforced epoxies. A comparison of the properties of cross-linked reinforced polyethylene sheet material laminates produced by the process of the invention with reinforced laminates fabricated of other conventional materials is set forth below in Table VI. The thicknesses of the laminate in each case was 125 mils.

TABLE VI
COMPARISON OF POLYETHYLENE-GLASS FABRIC REINFORCED LAMINATE PROPERTIES TO OTHER REINFORCED COMMERCIAL LAMINATE GRADES

|  | Glass Reinforced Polyester | Glass Reinforced Polyethylene | Glass Fabric Reinforced Epoxy | Paper Reinforced Epoxy |
|---|---|---|---|---|
| Water Absorption, % | 0.10–0.40 | 0.034–0.050 | 0.02–0.06 | 0.04–4.5 |
| Tensile Strength, A, psi | 11,000–35,000 | 12,487–18,202 | 45,000–50,000 | 7,000–18,000 |
| Compressive strength, psi | flatwise 8,200–52,000 | edgewise 5,165–7,730 | flatwise 50,000–80,000 | flatwise 25,000–42,000 |
| Flexural Strength A, psi | 25,000–41,000 | 27,402–24,612 | 25,000–75,000 | 16,000–26,000 |
| Dielectric Strength, V/mil | 330–485 | 700 | up to 550 | 150–600 |
| Power Factor | 0.0075–0.030 | 0.008–0.011 | 0.003–0.018 | 0.029–0.060 |
| Dielectric Constant | 4.0–5.5 | 2.56–3.09 | 4.2–5.2 | 4.0–5.5 |

In each of the foregoing examples, the glass fabric substrates had the following physical properties according to style:

| Style | O.S.Y. | Thickness, Inches | Threads/In. Warp × Fill | Yarn Warp × Fill | Weave |
|---|---|---|---|---|---|
| 108 | 1.43 | 0.0020 | 60 × 47 | 900½ × 900½ | Plain |
| 7628 | 6.00 | 0.0068 | 44 × 32 | 75-1/0 × 75-1/0 | Plain |
| 7637 | 6.95 | 0.0090 | 44 × 22 | 75-1/0 × 37-1/0 | Plain |

EXAMPLE V

A polyethylene polymer with the same properties as that used in Example I was extruded as a tube having a wall thickness of 4 mils by means of an extruder having a nozzle attached to a circular die. The resulting tube was then expanded into an elongated tube having a wall thickness of approximately 1 mil by blowing compressed air into the tube through the die at a constant pressure ranging between about 10 and 20 p.s.i. The tube was then flattened by a plurality of guide rolls and a pair of pinch rolls at its end opposite the die and wound on a wind-up roll. The flattened tube was subsequently unwound, slit along one side and then laid flat to form a continuous sheet. The sheet material so produced was then further processed by applying the sheet material to various substrates in the same manner as set forth in Examples I through IV. Laminates having physical and chemical properties comparable to those set forth in Tables I through VI were obtained.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A process of producing reinforced laminates from crosslinkable thermoplastic olefin polymer material, comprising the steps of heating a normally solid, high molecular weight crosslinkable thermoplastic olefin polymer selected from the group consisting of ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970 and containing an acetylenic diperoxy catalyst which reacts with and effects crosslinking of said polymer and which has a decomposition temperature between about 310° F. and about 525° F., to a molten state at a melting temperature between about 270° F. and 300° F., forming a continuous non-reinforced sheet from said molten polymer at a temperature below said decomposition temperature, cooling said continuous sheet to a temperature below said melting temperature to a self-supporting, two-dimensional molecular state, combining said sheet in said self-supporting state with a glass fibrous substrate treated with an unsaturated organosilanol coupling agent which reacts with said polymer and said glass fibrous substrate and effects bonding of said polymer to said substrate to form a laminate, heating said laminate under pressure to a temperature between about 310° F. and about 525° F. to react said catalyst with said polymer and effect at least 80% crosslinking of said polymer to a three-dimensional molecular state, and cooling said laminate to a temperature below said melting temperature to a self-supporting state.

2. The process recited in claim 1, wherein said polymer contains a thiodipropionate acid ester flame-retardant and said catalyst.

3. The process recited in claim 2, wherein said flame-retardant comprises dilaurylthiodipropionate.

4. The process recited in claim 1, wherein said catalyst comprises 2,5 dimethyl 2,5-di(t-butylperoxy)hexyne-3.

5. The process recited in claim 1, further comprising the steps of cutting and shaping said laminate subsequent to said step of combining and prior to said step of heating said laminate.

6. The process recited in claim 1, wherein said step of forming comprises extruding said molten polymer at a temperature between about 270° F. and about 300° F. to form a continuous sheet from said polymer.

7. The process recited in claim 1, wherein said step of forming comprises extruding said molten polymer at a temperature between about 270° F. and 300° F. to form a tube closed at one end thereof, blowing air into said tube under pressure from the other end thereof to expand said tube and form an elongated tube having a predetermined wall thickness, flattening said elongated tube, slitting said flattened tube along at least one side thereof so as to form a continuous sheet from said polymer.

8. The process recited in claim 7, wherein said step of slitting comprises slitting said flattened tube along one side thereof and laying said tube flat so as to form a continuous sheet from said polymer.

9. The process recited in claim 7, wherein said step of slitting comprises slitting said flattened tube along both sides thereof so as to form a continuous sheet from said polymer.

10. The process recited in claim 1, wherein said step of heating comprises heating said laminate under pressure to a temperature between about 310° F. and about 525° F. to react said catalyst with said polymer and effect about 95% crosslinking of said polymer.

11. The process recited in claim 1, further comprising the steps of cutting and shaping said laminate and superposing a plurality of said laminates subsequent to said step of combining and prior to said step of heating said laminate, and wherein said step of heating said laminate comprises heating said superposed laminates under pressure to a temperature between about 310° F. and about 525° F. to react said catalyst with said polymer and effect at least 80% crosslinking of said polymer to a three-dimensional molecular state and combine said plurality of superposed laminates.

12. The process recited in claim 11, further comprising the step of combining a sheet of metallic foil with said laminate subsequent to said steps of cutting and shaping and prior to said step of heating said laminate.

13. The process recited in claim 12, wherein said step of combining said sheet of metallic foil with said laminate comprises combining a sheet of copper foil with said laminate.

14. The process recited in claim 1, further comprising the step of combining a sheet of metallic foil with said laminate subsequent to said step of combining said continuous sheet with said substrate and prior to said step of heating said laminate.

15. The process recited in claim 14, wherein said step of combining said sheet of metallic foil with said laminate comprises combining a sheet of copper foil with said laminate.

16. The process recited in claim 1, wherein said coupling agent comprises gamma-methacryloxypropyltrimethoxy silane.

17. A process of producing reinforced laminates from crosslinkable thermoplastic olefin polymer material, comprising the steps of heating a normally solid, high molecular weight crosslinkable thermoplastic olefin polymer selected from the group consisting of ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970 and containing an acetylenic diperoxy catalyst which reacts with and effects crosslinking of said polymer and which has a decomposition temperature between about 310° F. and about 525° F., to a molten state at a melting temperature between about 270° F. and 300° F., forming a continuous non-reinforced sheet in a two-dimensional molecular state from said molten polymer at a temperature below said decomposition temperature, applying said continuous sheet to a glass fibrous substrate treated with an unsaturated organosilanol coupling agent which reacts with said polymer and said glass fibrous substrate and effects bonding of said polymer to said substrate under pressure at a temperature above said melting temperature to form a continuous laminate, heating said laminate to a temperature between about 310° F. and about 525° F. to react said catalyst with said polymer and effect at least 80% crosslinking of said polymer to a three-dimensional molecular state, and cooling said laminate to a temperature below said melting temperature to a self-supporting state.

18. The process recited in claim 17, wherein said catalyst comprises 2,5 dimethyl 2,5-di(t-butylperoxy) hexyne-3.

19. The process recited in claim 17, wherein said step of forming comprises extruding said molten polymer at a temperature between about 270° F. and about 300° F. to form a continuous sheet from said polymer.

20. The process recited in claim 17, wherein said step of heating comprises heating said laminate under pressure to a temperature between about 310° F. and 525° F. to react said catalyst with said polymer and effect about 95% crosslinking of said polymer.

21. The process recited in claim 17, wherein said step of applying comprises applying said continuous sheet under pressure to a glass fibrous substrate at a temperature of at least 270° F. to cause said sheet to impregnate said glass fibrous substrate and form a continuous laminate.

22. The process recited in claim 17, wherein said coupling agent comprises gamma-methacryloxypropyl-trimethoxy silane.

23. The process recited in claim 17, wherein said step of forming comprises extruding said molten polymer at a temperature between about 270° F. and 300° F. to form a tube closed at one end thereof, blowing air into said tube from the other end thereof under pressure to expand said tube and form an elongated tube having a predetermined wall thickness, flattening said elongated tube, and slitting said flattened tube along at least one side thereof so as to form a continuous sheet from said polymer.

24. The process recited in claim 23, wherein said step of slitting comprises slitting said flattened tube along one side thereof and laying said tube flat so as to form a continuous sheet from said polymer.

25. The process recited in claim 23, wherein said step of slitting comprises slitting said flattened tube along both sides thereof so as to form a continuous sheet from said polymer.

26. The process recited in claim 17, further comprising the step of applying a sheet of metallic foil to at least one surface of said laminate subsequent to said step of applying and prior to said step of heating said laminate.

27. The process recited in claim 26, wherein said step of applying said sheet of metallic foil comprises applying a sheet of copper foil to at least one surface of said laminate.

28. The process recited in claim 17, wherein said polymer contains a thiodipropionate acid ester flame-retardant and said catalyst.

29. The process recited in claim 28, wherein said flame-retardant comprises dilaurylthiodipropionate.

30. A process of producing reinforced laminates from crosslinkable thermoplastic olefin polymer material, comprising the steps of heating a normally solid, high molecular weight crosslinkable thermoplastic olefin polymer selected from the group consisting of ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970 and containing an acetylenic diperoxy catalyst which reacts with and effects crosslinking of said polymer and which has a decomposition temperature between about 310° F. and 525° F., to a molten state at a melting temperature between about 270° F. and 300° F., forming a continuous non-reinforced sheet in a two-dimensional molecular state from said molten polymer at a temperature below said decomposition temperature, applying said continuous sheet to a glass fibrous substrate treated with an unsaturated organosilanol coupling agent which reacts with said polymer and said glass fibrous substrate and effects bonding of said polymer to said substrate at a temperature above said melting temperature to form a continuous laminate, cooling said laminate to a temperature below said melting temperature to a self-supporting state, heating said laminate under pressure to a temperature between about 310° F. and about 525° F. to react said catalyst with said polymer and effect at least 80% crosslinking of said polymer to a three-dimensional molecular state, and cooling said heated laminate to a temperature below said melting temperature to a self-supporting state.

31. The process recited in claim 30, wherein said catalyst comprises 2,5 dimethyl 2,5-di(t-butylperoxy) hexyne-3.

32. The process recited in claim 30, wherein said step of forming comprises extruding said molten polymer at a temperature between about 270° F. and about 300° F. to form a continuous sheet from said polymer.

33. The process recited in claim 30, wherein said step of heating comprises heating said laminate under pressure to a temperature between about 310° F. and 525° F. to react said catalyst with said polymer and effect about 95% crosslinking of said polymer.

34. The process recited in claim 30, wherein said step of applying comprises applying said continuous sheet under pressure to a glass fibrous substrate at a temperature of at least 270° F. to cause said sheet to impregnate said glass fibrous substrate and form a continuous laminate.

35. The process recited in claim 30, wherein said coupling agent comprises gamma-methacryloxypropyl-trimethoxy silane.

36. The process recited in claim 30, further comprising the steps of cutting and shaping said laminate subsequent to said step of cooling said laminate and prior to said step of heating said laminate.

37. The process recited in claim 30, wherein said step of forming comprises extruding said molten polymer at a temperature between about 270° F. and 300° F. to form a tube closed at one end thereof, blowing air into said tube from the other end thereof under pressure to expand said tube and form an elongated tube having a predetermined wall thickness, flattening said elongated tube, and slitting said flattened tube along at least one side thereof so as to form a continuous sheet from said polymer.

38. The process recited in claim 37, wherein said step of slitting comprises slitting said flattened tube along one side thereof and laying said tube flat so as to form a continuous sheet from said polymer.

39. The process recited in claim 37, wherein said step of slitting comprises slitting said flattened tube along both sides thereof so as to form a continuous sheet from said polymer.

40. The process recited in claim 30, further comprising the step of applying a sheet of metallic foil to at least one surface of said laminate subsequent to said step of applying and prior to said step of heating said laminate.

41. The process recited in claim 40, wherein said step of applying said sheet of metallic foil comprises applying a sheet of copper foil to at least one surface of said laminate.

42. The process recited in claim 30, wherein said polymer contains a thiodipropionate acid ester flame-retardant and said catalyst.

43. The process recited in claim 42, wherein said flame-retardant comprises dilaurylthiodipropionate.

44. The process recited in claim 30, further comprising the steps of cutting and shaping said laminate and superposing a plurality of said laminates subsequent to said step of cooling said laminate and prior to said step of heating said laminate, and wherein said step of heating said laminate comprises heating said superposed laminates under pressure to a temperature between about 310° F. and about 525° F. to react said catalyst with said polymer and effect at least 80% crosslinking of said polymer to a three-dimensional molecular state and combine said plurality of superposed laminates.

45. The process recited in claim 44, further comprising the step of applying a sheet of metallic foil to at least one surface of said laminate subsequent to said steps of cutting and shaping and prior to said step of heating said laminate.

46. The process recited in claim 45, wherein said step of applying said sheet of metallic foil comprises applying a sheet of copper foil to at least one surface of said laminate.

47. The process of producing reinforced laminates from crosslinkable thermoplastic olefin polymer material, comprising the steps of heating a normally solid, high molecular weight crosslinkable thermoplastic olefin polymer selected from the group consisting of ethylene homopolymers, copolymers of ethylene and at least one acyclic mono-1 olefin hydrocarbon having 2 to 8 carbon atoms per molecule, and mixtures thereof, having a melt index of at least about 10, and a density in the range of 0.910 to 0.970, and containing dilaurylthiodipropionate as a flame-retardant and 2,5 dimethyl 2,5-di(t-butylperoxy)hexyne-3 as a catalyst to a molten state at a temperature between about 270° F. and 300° F., extruding said molten polymer at a temperature between about 270° F. and about 300° F. to form a continuous non-reinforced sheet in a two-dimensional molecular state from said polymer, applying said continuous sheet under pressure at a temperature between about 270° F. and about 300° F. to a glass fibrous substrate treated with a gamma-methacryloxypropyltrimethoxy silane coupling agent which reacts with said polymer and said glass fibrous substrate and effects bonding of said sheet to said substrate to form a laminate, heating said laminate under pressure to a temperature between about 310° F. and about 525° F. to effect about 95% crosslinking of said polymer to a three-dimensional molecular state, and cooling said heated laminate to a temperature below 270° F. to a self-supporting state.

48. The process recited in claim 47, further comprising the step of applying a sheet of metallic foil to at least one surface of said laminate subsequent to said step of applying and prior to said step of heating said laminate.

49. The process recited in claim 48, wherein said step of applying said sheet of metallic foil comprises applying a sheet of copper foil to at least one surface of said laminate.

50. The process recited in claim 49, further comprising the step of cooling said laminate to a temperature below said melting temperature to a self-supporting state subsequent to said step of applying and prior to said step of heating said laminate, and wherein said step of applying comprises applying said continuous sheet to said glass fibrous substrate to form a continuous laminate.

51. The process recited in claim 50, further comprising the steps of cutting and shaping said laminate subsequent to said step of cooling said laminate and prior to said step of heating said laminate.

52. The process recited in claim 50, further comprising the steps of cutting and shaping said laminate and superposing a plurality of said laminates subsequent to said step of cooling said laminate and prior to said step of heating said laminate, and wherein said step of heating said laminate comprises heating said superposed laminates under pressure to a temperature between about 310° F. and about 525° F. to effect said crosslinking of said polymer to a three-dimensional molecular state and combine said plurality of superposed laminates.

53. The process recited in claim 52, further comprising the step of applying a sheet of metallic foil to at least one surface of said laminate subsequent to said steps of cutting and shaping and prior to said step of heating said laminate.

54. The process recited in claim 53, wherein said step of applying said sheet of metallic foil comprises applying a sheet of copper foil to at least one surface of said laminate.

55. The process recited in claim 47, wherein said step of extruding comprises extruding said molten polymer at a temperature between about 270° F. and 300° F. to form a tube closed at one end thereof, blowing air into said tube from the other end thereof under pressure to expand said tube and form an elongated tube having a predetermined wall thickness, flattening said elongated tube, and slitting said elongated tube along at least one side thereof so as to form a continuous sheet from said polymer.

56. The process recited in claim 55, wherein said step of slitting comprises slitting said flattened tube along one side thereof and laying said tube flat so as to form a continuous sheet from said polymer.

57. The process recited in claim 55, wherein said step of slitting comprises slitting said flattened tube along both sides thereof so as to form a continuous sheet from said polymer.

* * * * *